United States Patent [19]

Hirabayashi

[11] Patent Number: 5,751,856
[45] Date of Patent: May 12, 1998

[54] SYSTEM FOR PROCESSING A QUANTIZED VECTOR USING SPATIAL FREQUENCY CORRELATIONS

[75] Inventor: Yasuji Hirabayashi, Tokyo, Japan

[73] Assignee: Canon Kabushiki Kaisha, Tokyo, Japan

[21] Appl. No.: 326,809

[22] Filed: Oct. 19, 1994

Related U.S. Application Data

[63] Continuation of Ser. No. 987,241, Dec. 7, 1992, abandoned, which is a continuation of Ser. No. 483,794, Feb. 23, 1990, abandoned.

[30] Foreign Application Priority Data

Feb. 28, 1989 [JP] Japan .................. 1-45441

[51] Int. Cl.$^6$ .................................... G06K 9/36
[52] U.S. Cl. .................................... 382/232
[58] Field of Search ................ 382/17, 43, 56; 348/384, 414

[56] References Cited

U.S. PATENT DOCUMENTS

| | | | |
|---|---|---|---|
| 3,984,626 | 10/1976 | Mounts et al. | 178/6 |
| 4,189,748 | 2/1980 | Reis | 358/433 |
| 4,446,530 | 5/1984 | Tsuboka | 364/725 |
| 4,567,518 | 1/1986 | Driessen | 382/43 |
| 4,580,162 | 4/1986 | Mori | 358/135 |
| 4,698,689 | 10/1987 | Tzou | 358/433 |
| 4,751,742 | 6/1988 | Meeker | 382/43 |
| 4,772,946 | 9/1988 | Hammer | 358/133 |
| 4,797,739 | 1/1989 | Tanaka | 358/433 |
| 4,805,030 | 2/1989 | Tanaka | 358/433 |
| 4,894,713 | 1/1990 | Delogne et al. | 364/725 |
| 4,910,608 | 3/1990 | Whiteman et al. | 358/433 |
| 4,920,426 | 4/1990 | Hatori et al. | 358/433 |
| 5,006,931 | 4/1991 | Shirota | 364/725 |

FOREIGN PATENT DOCUMENTS

| | | | |
|---|---|---|---|
| 0097858 | 1/1984 | European Pat. Off. | H03M 7/30 |
| 0227956 | 7/1987 | European Pat. Off. | H04N 7/12 |
| 3132225 | 5/1982 | Germany | G06F 15/332 |
| 3638572 | 5/1987 | Germany | G06F 15/347 |

*Primary Examiner*—Jose L. Couso
*Attorney, Agent, or Firm*—Fitzpatrick, Cella, Harper & Scinto

[57] ABSTRACT

A quantized vector decoder, a method of making the code book therefor, a system for transferring quantized vector, an image processing apparatus utilizing the vector quantization, and a vector quantizer are disclosed, the quantized vector being arranged to decode codes, which have been formed by vector-quantizing vectors formed of collecting a plurality of data items correlating to one another into output vectors, the decoder comprising: an input device for receiving the codes; a code book for previously storing the output vectors of the vector-quantized codes, each of the output vectors in the code book being constituted by a first output-vector component portion and a second output vector component portion; a retrieval device for retrieving the output vectors in the code book depending upon the correspondence between an input code and the first output-vector component portion; and an output device for transmitting the retrieved output vectors in the form of a combination of their first and second output vector component portions.

20 Claims, 15 Drawing Sheets

|  DC | A1 | A2 | A3 |
|-----|----|----|----|
| A4  | A5 | A6 | A7 |
| A8  | A9 | A10| A11|
| A12 | A13| A14| A15|
F I G. 2A
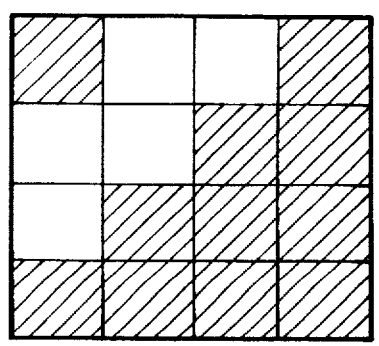
F I G. 2C

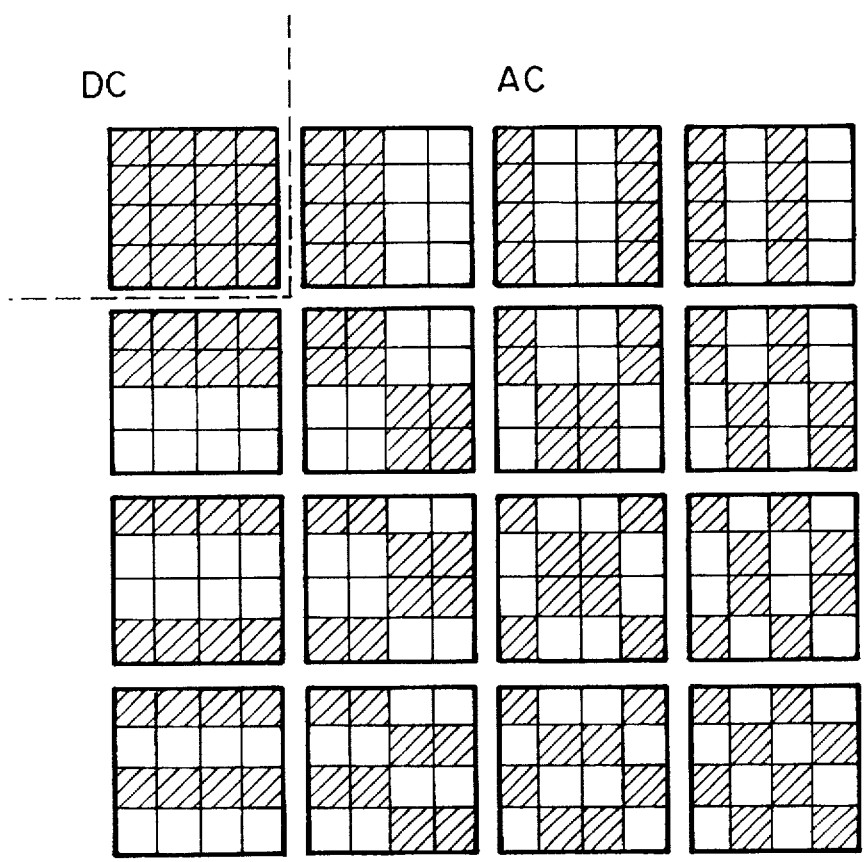
F I G. 2B

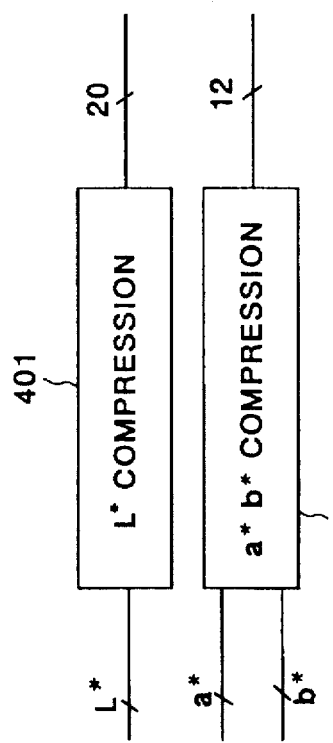
F I G. 10A
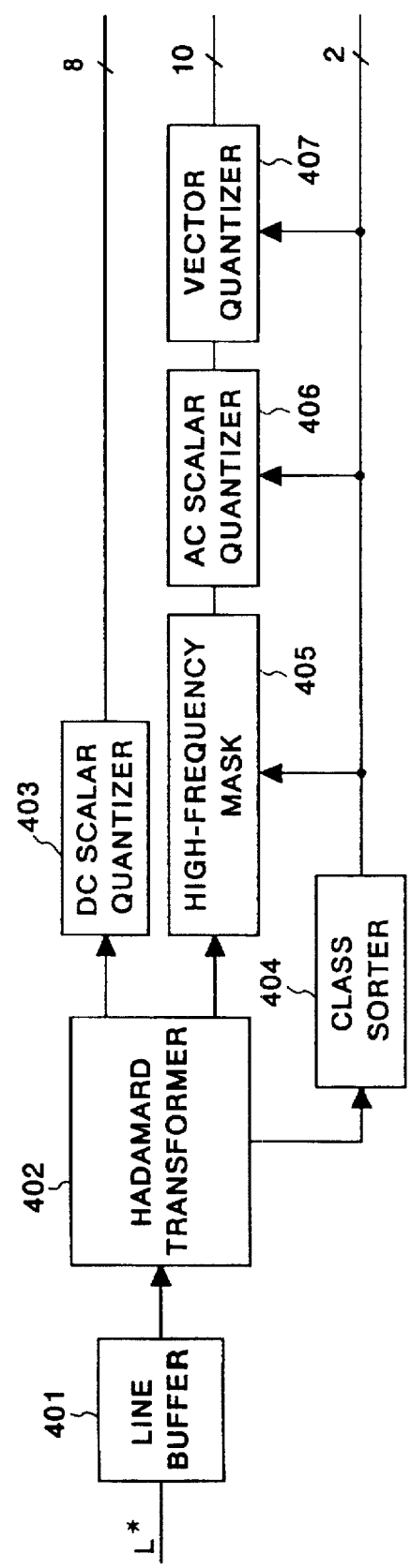
F I G. 10B

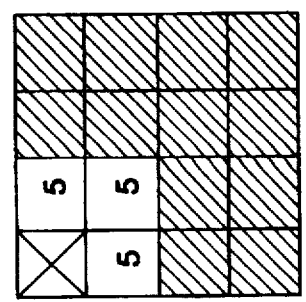
FIG. 11A CLASS 0
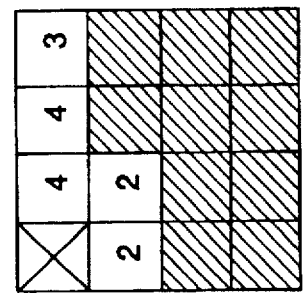
FIG. 11B CLASS 1
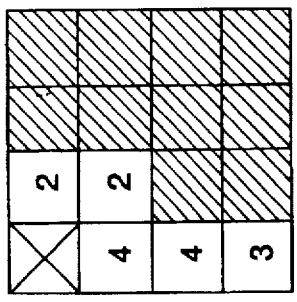
FIG. 11C CLASS 2
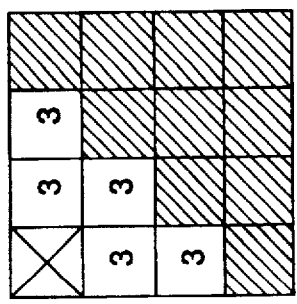
FIG. 11D CLASS 3
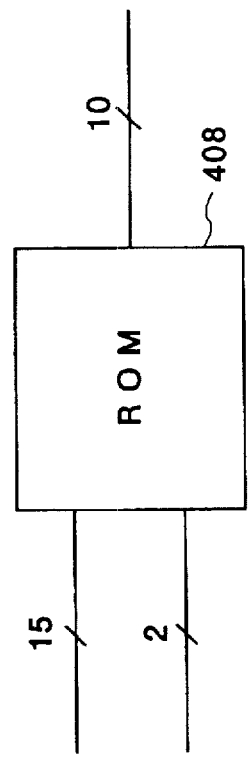
FIG. 12

Class 0

| Index | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|
| 0 | 5 | 0 | 19 | 12 | 0 | 0 | 10 | 0 | 0 | 0 | 4 | 0 | 0 | 10 | 0 |
| 1 | 20 | 40 | 0 | 23 | 22 | 11 | 0 | 0 | 31 | 0 | 10 | 29 | 0 | 3 | 0 |
| 2 | 50 | 0 | 30 | 50 | 40 | 0 | 20 | 40 | 6 | 20 | 10 | 0 | 0 | 8 | 5 |
| ⋮ | | | | | | | | | | | | | | | |
| 1022 | 57 | 39 | 25 | 5 | 40 | 30 | 20 | 40 | 21 | 20 | 10 | 7 | 0 | 2 | 5 |
| 1023 | 51 | 40 | 7 | 50 | 40 | 35 | 10 | 40 | 30 | 20 | 0 | 30 | 9 | 10 | 5 |

FIG. 13A

Class 1

| Index | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|
| 0 | 34 | 23 | 5 | 50 | 40 | 30 | 12 | 0 | 0 | 34 | 23 | 5 | 23 | 32 | 34 |
| 1 | 40 | 30 | 62 | 33 | 33 | 46 | 23 | 22 | 11 | 40 | 30 | 62 | 50 | 40 | 30 |
| 2 | 44 | 2 | 20 | 50 | 40 | 30 | 50 | 40 | 0 | 44 | 2 | 20 | 95 | 77 | 8 |
| ⋮ | | | | | | | | | | | | | | | |
| 1022 | 10 | 7 | 0 | 57 | 39 | 25 | 20 | 10 | 62 | 5 | 40 | 30 | 33 | 33 | 46 |
| 1023 | 0 | 30 | 9 | 51 | 40 | 7 | 34 | 10 | 30 | 50 | 40 | 35 | 77 | 40 | 30 |

FIG. 13B

Class 2

| Index | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|
| 0 | 23 | 32 | 34 | 50 | 40 | 30 | 51 | 34 | 23 | 5 | 84 | 8 | 20 | 10 | 5 |
| 1 | 50 | 40 | 30 | 33 | 33 | 46 | 20 | 40 | 30 | 62 | 46 | 3 | 20 | 10 | 5 |
| 2 | 95 | 77 | 8 | 50 | 40 | 30 | 9 | 44 | 2 | 20 | 10 | 30 | 3 | 7 | 4 |
| ⋮ | | | | | | | | | | | | | | | |
| 1022 | 33 | 33 | 46 | 20 | 40 | 30 | 3 | 7 | 4 | 20 | 10 | 62 | 20 | 10 | 5 |
| 1023 | 77 | 40 | 30 | 40 | 30 | 62 | 20 | 8 | 30 | 34 | 10 | 30 | 34 | 50 | 5 |

F I G. 13C

Class 3

| Index | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|
| 0 | 50 | 40 | 30 | 23 | 32 | 34 | 12 | 0 | 0 | 50 | 40 | 30 | 34 | 23 | 5 |
| 1 | 33 | 33 | 46 | 50 | 40 | 30 | 23 | 22 | 11 | 33 | 33 | 46 | 40 | 30 | 62 |
| 2 | 50 | 40 | 30 | 95 | 77 | 8 | 50 | 40 | 0 | 50 | 40 | 30 | 44 | 2 | 20 |
| ⋮ | | | | | | | | | | | | | | | |
| 1022 | 20 | 10 | 62 | 33 | 33 | 46 | 5 | 40 | 30 | 10 | 7 | 0 | 57 | 39 | 25 |
| 1023 | 34 | 10 | 30 | 77 | 40 | 30 | 50 | 40 | 35 | 0 | 30 | 9 | 51 | 40 | 7 |

SYSTEM FOR PROCESSING A QUANTIZED VECTOR USING SPATIAL FREQUENCY CORRELATIONS

This application is a continuation of application Ser. No. 07/987,241 filed Dec. 7, 1992, now abandoned, which was a continuation of application Ser. No. 07/483,794 filed Feb. 23, 1990, now abandoned.

BACKGROUND OF THE INVENTION

The present invention relates to a decoder for quantized-vector using vector quantization and capable of compressing information sources which strongly correlate to one another, such as audio information or image information, and to a method of making the code book therefor, a system for transferring quantized vector, and an image processing apparatus utilizing the vector quantization.

Vector quantization has been known as an efficient non-permanent information type encoding method.

Vector quantization which handles a plurality of information data always confronts a critical problem of reducing the amount of input data since the processing time and the size of the hardware respectively increase exponentially in proportion to the number of data items to be handled.

For example, image data is sometimes vector-quantized in accordance with the following steps: cutting image data in the block units; rendering the image data to be subjected to orthogonal transform such as discrete Fourier transform and discrete cosine transform so as to convert the image data into frequency data; and thus vector-quantizing the converted data. The above-described vector-quantization utilizes the characteristics of the orthgonally transformed image data so that energy is concentrated in the low frequency band and thereby redundancy can be restricted. In case image data is vector-quantized, the process of masking the high frequency portion from which intense energy rarely outputs is subjected to a masking processing in addition to the above-described orthogonal transform.

As a result of the above-described processes, the number of data items is reduced during the first stage of the overall vector quantization. Proposals concerning the above-described vector-quantization have been made in U.S. Ser. Nos. 261,276 and 312,775.

If the above-described method of masking the high frequency portion of the image is employed, the amount of input data for vector quantization is reduced. Therefore, the quantity of calculations required to retrieve the output vector can be restricted. Also during the above-described retrieval process, the vector data in the code book, to which reference is made, usually has no high frequency data similarly to the input data. The reason for this lies in that the expected value of the conversion coefficient of the base, in which a high frequency is present, is "0" when the overall image to be input is considered.

The above-described vector quantization in which the high frequency data is removed will cause a relatively high quality quantized image to be obtained even if it is applied to a usual image. However, critical quantization errors cannot be prevented in the portions having sharp edges or thin line structures. Furthermore, some images such as fine images of one pixel width cannot be reproduced at all without the high frequency components.

The deterioration in image quality due to the above-described quantization errors will become even more critical problem due to the wide use of highly precise images.

It might be considered to employ processing of supplying a noise component, whose average level is zero, to the high frequency region as a method of compensating the masked high frequency component. However, the above-described method cannot substantially overcome the above-described problem, and, what is worse, a further critical error can occur. Although the above-described problem can, of course, be overcome if the structure is arranged in which the above-described masking of the high frequency band is not employed, the vector quantization cannot be put into practical use since the processing system increases exponentially in proportion to the number of the frequency components to which a reference is made.

SUMMARY OF THE INVENTION

An object of the invention is to provide a quantized vector decoding apparatus capable of generating an output vector approximating the original information when the output vector is generated from a vector-quantized code, and to a method of making such as code book therefor.

Another object of the invention is to provide a system for transferring a quantized vector capable of both raising the retrieval speed in such code book and improving the quality of the output vector on the decoding side when the quantized data is generated or encoded.

A further object of the invention is to provide an image processing apparatus capable of improving the quality of the data in the high frequency band of the input image.

A still further object of the invention is to provide a vector quantizer capable of changing the code book, for use in the vector quantization processing, in accordance with the result of a classification of the characteristics of the high frequency information of the input data.

In order to achieve the above-described object, according to the present invention, there is provided a quantized vector decoding apparatus for decoding, into output vector, a code which has been formed by vector-quantizing vector formed of a plurality of data items correlating to one another, said decoder comprising: input means for receiving said code; storage means for in advance storing said output vectors corresponding to the said code, each of said output vectors in said storage means being constituted by a first output-vector component portion and a second output vector component portion; retrieval means for retrieving an output vector in said storage means based upon the correspondence between an input code and said first output-vector component portion; and output means for transmitting said retrieved output vector in the form of a combination of their first and second output vector component portions.

In general, an output vector of n-dimension is necessary for decoding a vector-quantized code. However, vector quantization is inevitably limited to m-dimensional (m<n) input due to the restricted calculating time and the hardware size. Therefore, data of n-dimension is used when storage means for an output is designed. That is, a storage means is made in such a manner that it includes a first output vector component portion and a second output vector component portion. The retrieval of the contents of the storage means is performed by using only the m-dimensional data (that is, the first output vector component portion) and data of other dimensions which has not been used in the above-described retrieval is transmitted so as to overcome the above-described problem.

A preferred aspect of the present invention lies in a fact that the plurality of data items which correlate to one another are a plurality of image data arranged to be adjacent to one another in a one-dimensional direction or a two-dimensional direction so as to form a block.

According to a preferred aspect of the present invention, when the output vectors are previously stored in the storage means, the storage means stores the output vectors in the form structured by orthogonally converting input vectors acting to generate the output vectors into frequency data and by arranging low frequency data of the frequency data to be the first output vector component portion and high frequency data of the same to be the second output vector component portion. That is, the storage means stores the first and second output vector component portions in such a manner that the first and second output vector component portions are separated from each other, so that only the first output vector component portion is used at the time of the retrieval. Therefore, the retrieving speed can be raised and the two component portions can be transmitted. As a result, the quality in the original reproduction can be improved.

According to a preferred aspect of the present invention, the orthogonal transform is Hadamard transform.

According to a preferred aspect of the present invention, the output means includes means for subjecting the output vector to inverse orthogonal transform.

According to the present invention, there is provided a method of making a code book for the decoding apparatus according to claim 1, wherein said output vectors have been stored in said storage means in advance by steps: orthogonally converting input vectors acting to generate said output vectors into frequency data; arranging low frequency data of said frequency data to be said first output vector component portion and high frequency data of the same to be said second output vector component portion; and having the obtained output vectors stored in said storage means.

According to the present invention, there is provided A system for transferring a quantized vector comprising: (a) encoder means for generating codes by vector-quantizing input vector formed of a plurality of data items which correlate to one another; (b) receiving/transmitting means for receiving/transmitting said code; and (c) decoder means for retrieving a code book, which has in advance stored output vectors, in accordance with said received code and generating the retrieved output vector, said decoder means comprising: ($c_1$) first storage means for in advance storing said output vectors corresponding to said code, each of said output vectors in said first storage means being constituted by a first output-vector component portion and a second output vector component portion; ($c_2$) means for retrieving an output vector in said first storage means based upon the correspondence between an input code and said first output-vector component portion of the output vector, and outputting the retrieved output vector in the form of a combination of their first and second output vector component portions, and said encoder means comprising: ($a_1$) a second storage means for storing output vectors and relations between said output vectors and input codes, each of said output vectors being formed only by a first output vector component portion of each of output vectors in said first storage means.

As a result of the above-described system, the storage means such code books of the encoding side device and the decoding side device can be made a common type in terms of the first output vector component portion. Therefore, the decoding operation can be reliably performed. Furthermore, since the second output vector component portion is omitted, the retrieving speed in the encoding side can be raised or the capacity of the storage means can be reduced.

According to a preferred embodiment of the present invention, wherein, when said output vectors in said first storage means are stored in a form structured by orthogonally converting input vectors acting to generate said output vectors into frequency data and by arranging low frequency data of said frequency data to be said first output vector component portion and high frequency data of the same to be said second output vector component portion.

In order to achieve the above-described objects, according to the present invention, there is provided an image processing apparatus for improving image quality of the high frequency band of an input image comprising: first conversion means for converting input image data into frequency data; first discriminating means which classifies said frequency data into a first and a second frequency bands compensating so as to extract a first vector formed of frequency data included in said first frequency band; storage means for storing output vectors, each of said output vectors in said book means being constituted by a first output-vector component portion and a second output vector component portion; retrieval means for retrieving an approximate vector of said first vector in said storage means; second discriminating means for extracting a second vector formed of frequency data included in said second frequency band in accordance with the frequency of said approximate vector; and second conversion means which synthesizes said first and said second vectors for the purpose of converting its frequency data into spatial data.

According to the above-described image quality improving apparatus, the second frequency band of the original input data is removed by the mask, the second frequency band component which strongly correlate to the first frequency band component of the original input data is transmitted as a result of vector quantization, and this second frequency band component and the first frequency band of the original input data are synthesized so as to be transmitted. That is, the second band region of the original input data can be improved.

According to a preferred embodiment of the present invention, the above-described first frequency band is low frequency.

Other objects and advantage besides those discussed above shall be apparent to those skilled in the art from the description of a preferred embodiment of the invention which follows: In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 2A illustrates the structure of the matrix elements which can be obtained by Hadamard transformation;

FIG. 2B illustrates the structure of the sequence data which can be obtained by Hadamard transformation;

FIG. 2C illustrates a mask for masking the high frequency component and that for masking the DC component;

FIG. 10A is a block diagram which illustrates the structure of a compressor 303;

FIG. 10B is a block diagram which illustrates the structure of an L* compressor;

FIGS. 11A to 11D illustrate the masking position in a high frequency masking circuit;

FIG. 12 is a block diagram which illustrates the structure of a vector quantizer 407;

FIGS. 13A to 13D are tables illustrates the structure of data in a code book 408 according to a third embodiment;

FIG. 15 illustrates the base function of the Hadamard transformation for use in the first to third embodiments of the present invention.

DESCRIPTION OF THE PREFERRED EMBODIMENTS

Figure 1:
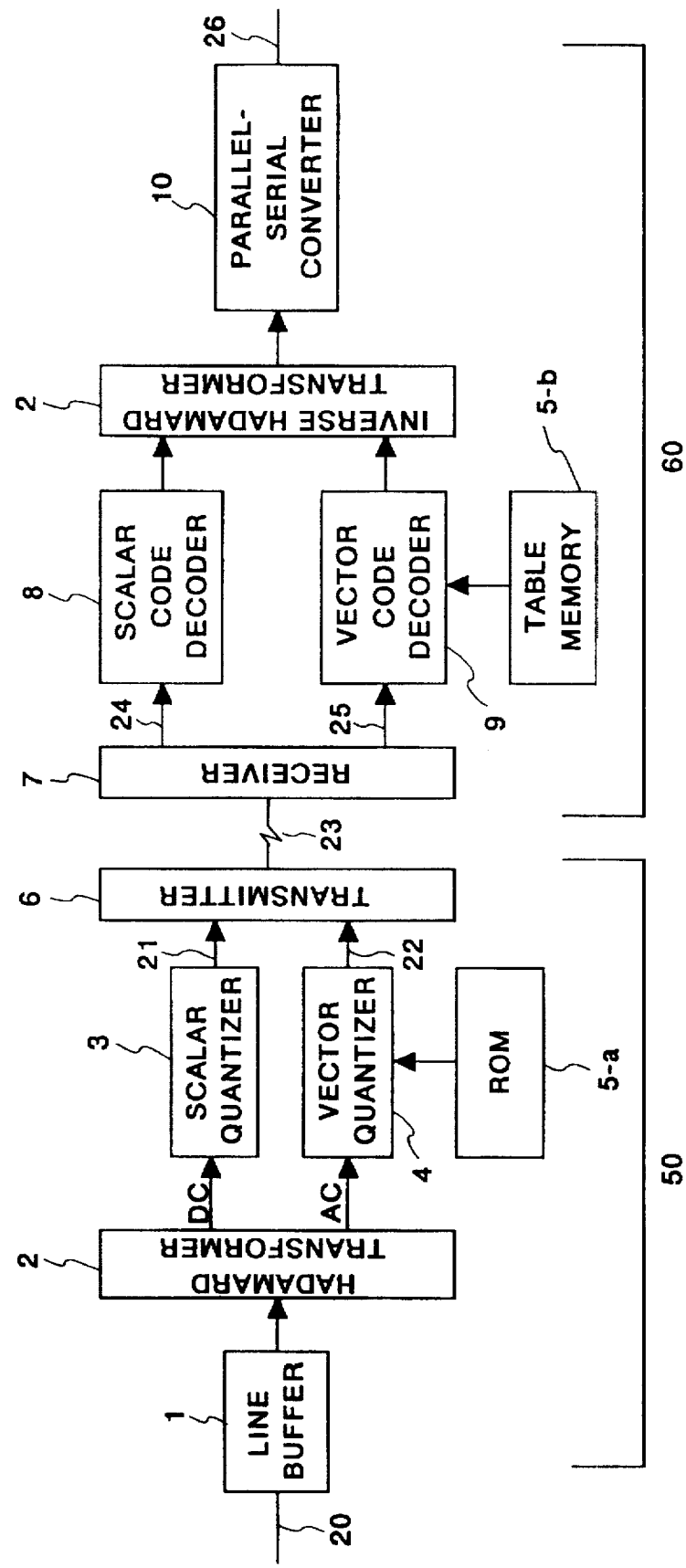
FIG. 1 is a block diagram which illustrates a first embodiment in which the present invention is applied to an image signal encoder/decoder.

According to the present invention, information suitable for collectively vector-quantizing a plurality of data items correlating to one another is handled, the information being image information or audio information. Then, preferred embodiments in which the present invention is applied to vector-quantization of image data will be described.

<Description of Principle>

In general, image data items strongly correlate to one another. Spectrums, generated when an image is cut into uniform blocks and the inside portion of each of the blocks is frequency-analyzed, show patterns which can frequently appear. Therefore, there is a high frequency spectrum which can be easily generated with respect to a certain low frequency spectrum. That is, there is the relationship between the high frequency portion and the low frequency portion of a spectrum obtained by frequency-analyzing one image block.

Image data specified by p which has been cut in block units is usually expressed by $BLK_p$ obtainable from:

$$BLK_p = \sum_{i=1}^{n} a_{pi} F_{pi} \quad (1)$$

where n: number of data items in a block f: base of orthogonal transform

In this state, it is assumed that the more i of $f_i$, the more its frequency is. The spectrum $B_p$ of $BLK_p$ is expressed by:

$$B_p = (a_{p1}, a_{p2}, a_{p3}, \ldots, a_{pn}) \quad (2)$$

The expected value of $a_{pj}$ with respect to overall vectors (p=1, 2, 3, ...) of the input image is zero when conversion coefficient $a_{pj}$ of the j-th (j>>1) high frequency is considered.

However, when only an input image whose low frequency band spectrum shows a certain pattern, the conversion coefficient $a_{pj}$ of the high frequency must be distributed in a region centered at a certain value due to the correlation with a low frequency spectrum. Furthermore, when energy of the low frequency band is large, also energy of the high frequency band is large. Therefore, the expected value of $a_{pj}$ which appears together with the lower frequency band pattern with large energy and obtained by changing p is not zero.

It is assumed that spectrums in a block (specified by number p) of an image to be input are $S_p$ (n dimension), their spectrums $S_{p1}$ (m dimension) to m dimension are in a low frequency, and the balance spectrums $S_{pn}$ (n−m dimension) are in a high frequency. Furthermore, it is assumed that the conversion coefficient $a_{pj}$ (j>>1) belongs to $S_{pn}$.

That is, the following relationships are held:

$$S_p = (a_{p1}, a_{p2}, \ldots, a_{pm}, a_{pm+1}, \ldots, a_{pn})$$

$$S_{p1} = (a_{p1}, a_{p2}, \ldots, a_{pm}, 0, 0, 0, \ldots, 0)$$

$$S_{pn} = (0, 0, 0, \ldots, a_{pm+1}, a_{pm+2}, \ldots, a_{pj}, \ldots, a_{pn})$$

$$S_p = S_{p1} + S_{pn} \quad (3)$$

As is shown, the average value of the j-th coefficient $a_{pj}$ obtained by changing p for the overall input image is zero. On the other hand, it is assumed that dispersion of the j-th coefficient $a_{pj}$ for the overall blocks of the input image is $V_j$. Furthermore, it is assumed that a certain quantized vector corresponding to input image block $S_p$ is:

$$C_p = C_{p1}, C_{p2}, C_{p3}, \ldots, C_{pm}, 0, 0, 0, \ldots, 0) \quad (4)$$

(1) First, errors when mapping from $S_p$ to $C_p$ is performed is considered. The mapping from $S_p$ to $C_p$ corresponds to the conventional technology in which the high frequency band is cut. The square error expected value of $a_{pj}$ of all of the inputs, when p is changed, becomes: $V_j$ (2) Then, errors, when it is assumed that $N_p$ is a set of high frequency noise vectors and mapping from $S_p$ to $C_p+N_p$ is performed, are considered. The above-described case corresponds to the case in which high frequency noise is added at the time of the decoding process described in the prior art. That is, assuming that a set of high frequency noise vector $N_p$ is expressed by:

$$N_p = (0, 0, 0, \ldots, 0, n_{pm+1}, n_{pm+2}, \ldots, n_{pj}, \ldots, n_{pn}) \quad (5)$$

and dispersion of coefficient $n_{pj}$ of the high frequency of this set for overall inputs is $V_j$ (which is the same value at the dispersion of $a_{pj}$), the square error expected value of $a_{pi}$ of all of the inputs becomes: $2V_j$ Therefore, if high frequency noise is added, the level of errors becomes enlarged in comparison to a case in which the high frequency band is cut.

(3) Then, a case where a mapping from $S_p$ to $C_p+E$ is performed is considered. In this consideration, E is defined to be as follows: image vector set formed by mapping the low frequency portion of all of the input images is called $Q_p$ expressed by:

$$Q_p = (q_{p1}, q_{p2}, \ldots, q_{pm}, q_{pm+1}, \ldots, q_{pn}) \quad (6)$$

that is, $Q_p \in S_p$ and mapping from $Q_p$ to C is performed. Assuming that the average and the dispersion of $q_i$ for all of the inputs obtained by calculating with p changed are $e_i$ and $v_i$, respectively, and E is defined as follows:

$$E=(0, 0, 0, \ldots, e_{m+1}, e_{m+2}, \ldots, e_p, \ldots, e_n) \quad (7)$$

Assuming that a mapping from $S_p$ to $C_p$+E has been performed in the case of a certain input S, the square error expected value of $a_{pj}$ becomes $V_j$.

(4) Then, the case in which a mapping from $S_p$ to $C_p$+$Q_{pn}$ is considered. It is provided that only the high frequency portion of the image vector set $Q_p$, formed by mapping the above-described low frequency portion to $C_p$, and expressed by:

$$Q_{pn}=(0, 0, \ldots, q_{pm+1}, \ldots, q_{pj}, \ldots, q_{pn}) \quad (8)$$

is subjected to the mapping from $S_p$ to $C_p$+$Q_{pn}$. The square error expected value of $a_{pj}$ becomes $2V_j$ if $Q_{pn}$ belongs to $Q_p$ regardless of $Q_{pn}$.

It is expected for $V_j$ to be smaller than $V_j$. Therefore, the quantization error of the mapping from $S_p$ to $C_p$+E can be made smaller than the mapping from $S_p$ to $C_p$. Furthermore, $V_i$ becomes smaller if the correlation between the spectrum vector $S_{pi}$ in the low frequency region of the input image and the high frequency conversion coefficient $a_{pj}$ is strong. As described above, error when the mapping from $S_p$ to $C_p$ is performed is $2V_j$. On the other hand, error when the mapping from $S_p$ to $C_p$+E is performed is $V_j$, and error when the mapping from $S_p$ to $C_p$+$Q_{pn}$ is performed in $2V_j$. Therefore, if there is a strong correlation which meets the following relationship:

$$V_j < \frac{V_j}{2} \quad (9)$$

quantization error can be reduced than when mapping from S to $C_p$ is performed if mapping is performed with an optional $Q_{pn}$ as follows:

$$S_p \to C_p+Q_{pn} \quad (10)$$

Thus, the image quality can be improved by applying the present invention to the vector quantization of the image. Then, a system for vector-quantizing an image, transferring the vector-quantized image code, and decoding the received code (a first embodiment), an apparatus according to an embodiment in which the present invention is applied to an improvement in image quality (a second embodiment), and an apparatus according to an embodiment in which the present invention is applied to a copying machine (a third embodiment) will be described.

<First Embodiment>

Application to an Image Vector-quantizing/decoding Apparatus

Structure of the Apparatus

Then, an embodiment in which the present invention is applied to vector quantization of an image signal will be described with reference to the drawings.

FIG. 1 is a block diagram which illustrates the overall structure of an image compressing/decoding system according to the first embodiment of the present invention. The image compressing/decoding system comprises a transmission side including an encoder 50 and a transmission passage 23, and a receive side including a decoder 60. Image data input through an image data line 20 is aligned into block data each of which is formed by 4 pixels×4 pixels by a line buffer 1 before subjected to orthogonal conversion by an Hadamard converter 2. As a result of this orthogonal transformation, the block data of 4 pixels×4 pixels is transformed to a DC component data DC and 15-dimensional AC component data AC ($A_1$ to $A_{15}$) as shown in FIG. 2A.

The DC component data DC is supplied to a scalar quantizer 3 in which it is scalar-quantized so as to be converted into the code of the scalar quantization level. The code of the DC component is supplied to a transmitter 6 via a signal line 21. On the other hand, the AC component data AC is vector-quantized in a vector quantizer 4. That is, the AC component data AC is subjected to the vector-quantization due to the reference made to the low frequency data of the AC component data AC, the reference being made in the vector quantizer 4. As a result, the vector code can be generated, the vector code being then supplied to the transmitter 6 through a signal line 22.

The transmitter 6 collects the above-described codes are sent to the decoder 60 via the transmission passage 23.

The receiver 7 divides the data thus transmitted into a scalar-quantized level code, which is a DC component of the image vector, and a vector code which is an AC component so that the scalar-quantized level code is supplied to the decoder 8 and the vector code is supplied to the decoder 9 via corresponding lines 24 and 25. The scalar decoder 8 generates the actual DC component value in accordance with the received code so as to output it to the Hadamard converter 2. The vector decoder 9 generates low frequency vector data and high frequency vector data in accordance with the received AC component code of the image so as to output them to the Hadamard converter 2. In this state, it must be considered that the vector code decoder 9 generates not only the low frequency vector code but also the high frequency vector code which was not used at the encoding operation in the encoder 50.

A Hadamard inverse converter 2 subjects the received actual DC component value and the low frequency and the high frequency vector data to inverse Hadamard transformation so that block data of an actual image is formed again. The block data which has been formed again is serially supplied to a signal line 26 via a signal line 26.

As described above, the structure and the operation of the apparatus shown in FIG. 1 are arranged. Then, the operation of the encoder 50 and the decoder 60 will be described in detail.

Vector-quantization on the Encoding Side

Sixteen items of sequency data transmitted after subjected to the Hadamard transformation are aligned into block data shown in FIG. 2A depending upon the level of the frequency. An element (1, 1) of a block formed by 4×4 sequency corresponds to the DC component which is subjected to the scalar quantization by the scalar quantizer 4 as described above.

The residual 15 sequency data ($A_1$ to $A_{15}$) are considered to be 15-dimensional vectors. Therefore, they are subjected to the vector quantization by the vector quantizer 4 in accordance with a code book stored in a ROM 5a. Basically, a code book 5a for the vector quantization provided for the encoding side and a code book 5b for decoding provided for the decoding side are the same code books. These code books 5a and 5b are representative 15 dimensional vectors which have been previously obtained by training a multiplicity of images.

The high frequency portion of the 15-dimensional AC component data to be supplied to the vector quantizer 4 are uniformly masked as shown in FIG. 2B. According to this embodiment, the high frequency portion is, for example, determined to be $A_3$, $A_6$, $A_7$, $A_9$ to $A_{15}$ as shown in FIG. 2B. Therefore, $A_1$, $A_2$, $A_4$, $A_5$ and $A_8$ are considered to be the low frequency portion. Thus, the AC component of the image data are reduced from the 15-dimensional data to 5-dimensional data after the orthogonal transformation.

The vector quantizer 4 selects a vector which is the nearest to the input vector of all of the vectors registered in the code book 5 so as to supply its index code to the line 22.

Figure 3:
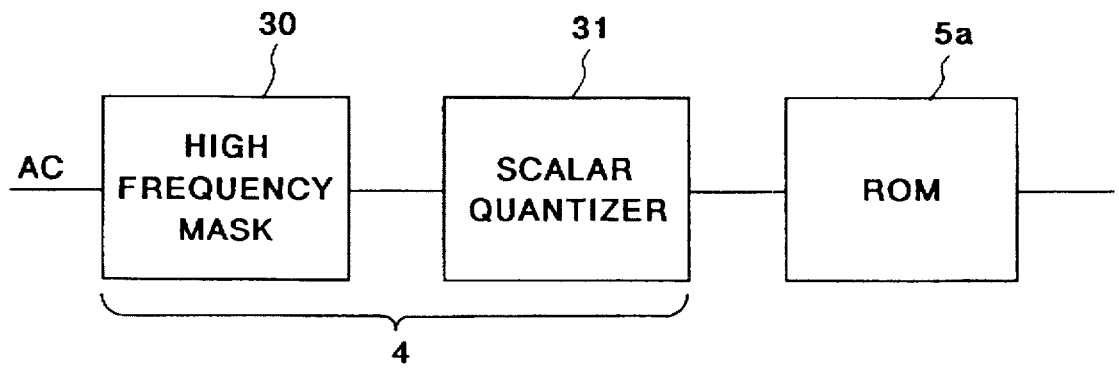
FIG. 3 is a block diagram of a vector quantizer for the encoding side according to the first embodiment.

According to this embodiment, the nearest vector is selected by employing a Look Up Table method with a ROM in which the scalar quantization is also used as shown in FIG. 3 as an alternative to distance calculations.

Figure 4:
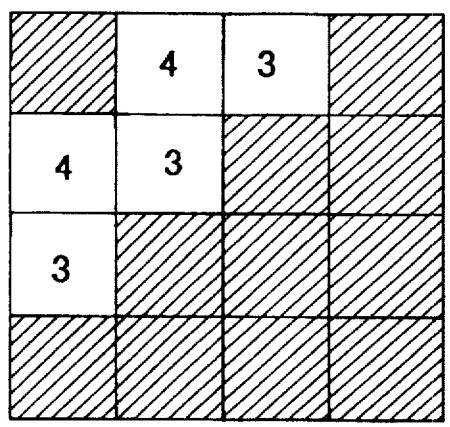
FIG. 4 illustrates the bit distribution in a scalar quantizer 31 included in a vector quantizer 4 according to the first embodiment.

FIG. 3 is a block diagram which illustrates a structure in which the vector quantizer 4 and the ROM 5a shown in FIG. 1 are arranged in accordance with the Look Up Table method. Referring to this drawing, the structure comprises a high frequency masking circuit 30, a scalar quantizer 31 and a ROM 5a. Referring to FIG. 3, the high frequency portion of the AC data which has been Hadamard transformed is uniformly masked to 0 in the high frequency masking portion 30 as shown in FIG. 2B. Data of elements A1, A2, A4, A5 and A8 which have not been masked are supplied to the scalar quantizer 31 in which their lower bits are cut in such a manner that a bit distribution as shown in FIG. 4 can be realized. That is, the number of bits of each of the elements A1, A2, A4, A5 and A8 is arranged to be "4", "3", "4", "3", and "3", respectively, and the total number of bits becomes 17. An output vector (the nearest vector) for all of the input states of the 17 bits has been previously carried out, and its index value has been written in the ROM 5a. Thus, the index of the nearest vector of the input vector can be immediately transmitted in the vector quantizer 4.

As described above, the calculation speed in the scalar quantizer 31 can be raised by applying a mask to the high frequency region before the quantization in the vector quantizer 4 as shown in FIG. 3. Furthermore, the size of the capacity of the ROM 5a can be reduced since it must store only low frequency data.

Vector Reconstruction on the Decoding Side

Figure 5:
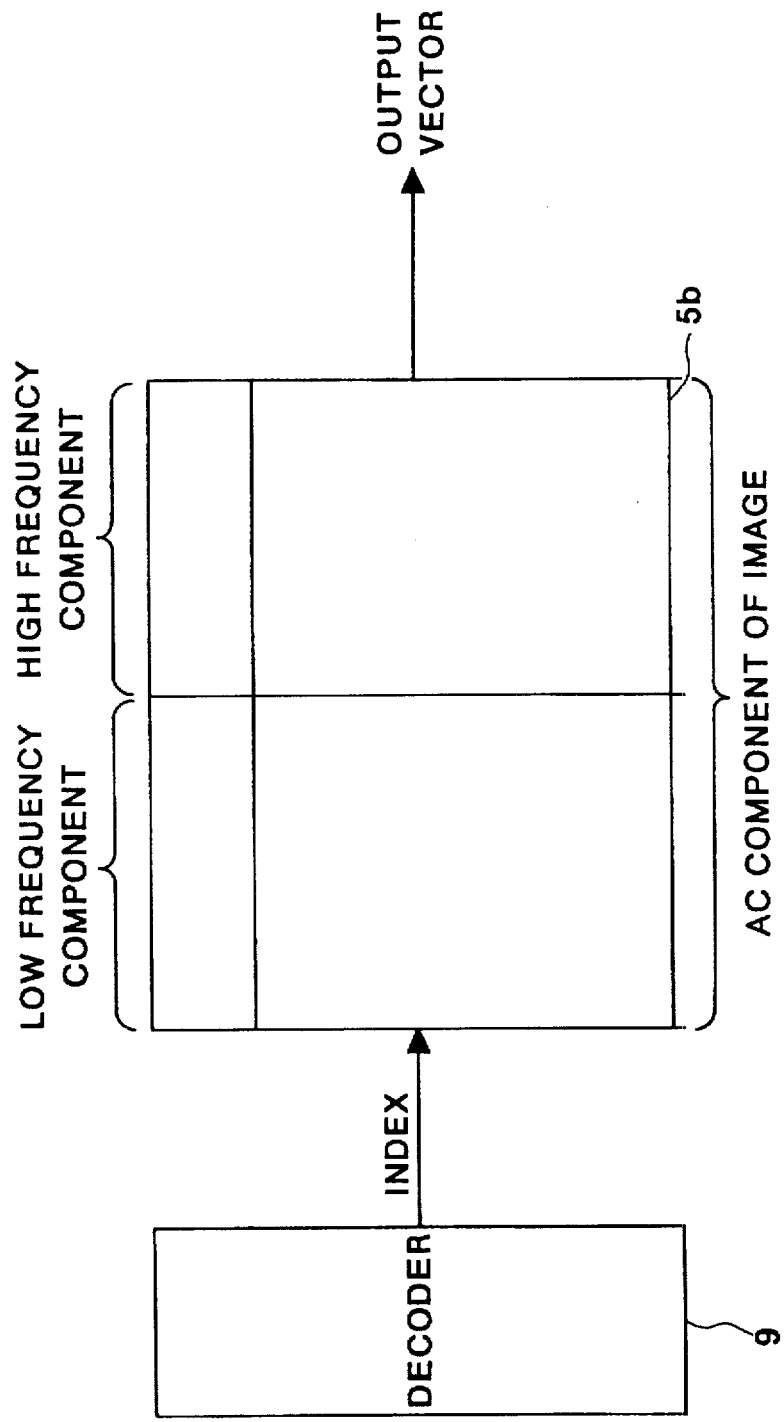
FIG. 5 illustrates the structure of a code book 5b for the decoding side according to the first embodiment.

The reproduction of the output vector in the decoding side vector decoder 9 will be described with reference to FIG. 5. The decoder 9 receives only the index code for vector-quantization obtained by the encoding side vector quantizer 4 in accordance with the low frequency component of the image data. The decoder reads out output vector data from the table memory 5b in accordance with the index code thus received. The output vector stored in the ROM 5b includes not only the vector data for low frequencies but also the vector data for high frequencies as shown in FIG. 5. The data read out at this time includes high frequency data which is expressed with the mask shown in FIG. 4. That is, since the ROM 5b reserves in its output vector not only the low frequency component but also the high frequency component, the reproduced image cannot deteriorate.

<Second Embodiment>

Application for Improving the Image Quality

Figure 6:
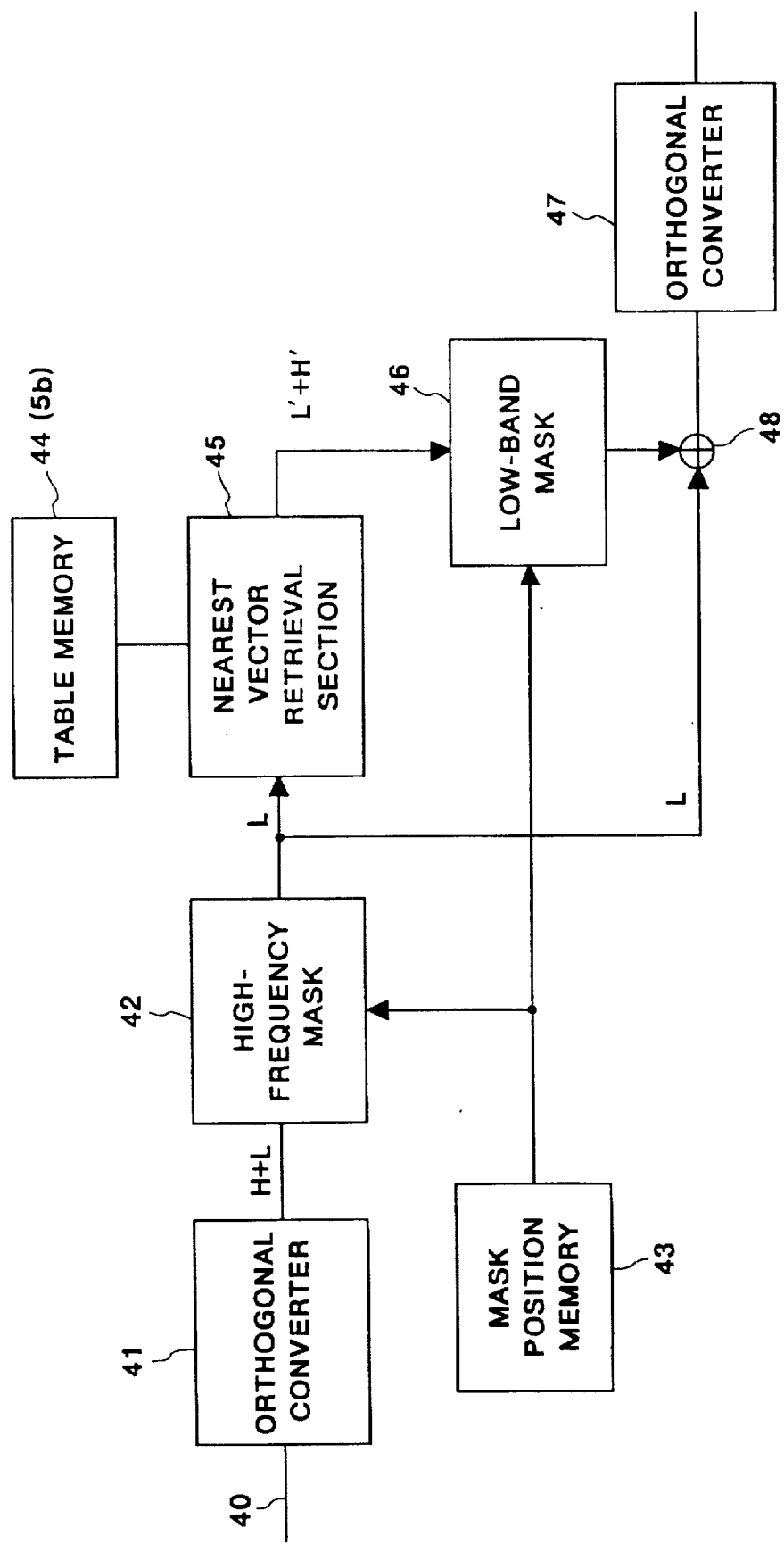
FIG. 6 illustrates the structure of an image quality improving apparatus according to a second embodiment of the present invention.

FIG. 6 illustrates the concept of an image quality improving apparatus according to a second embodiment in which the present invention is applied to an improvement in image quality. That is, the system shown in FIG. 1 (the first embodiment) acts to compress the input image by vector-quantization, and decoding and reproducing the thus compressed information after transferring or storing it. On the other hand, the image quality improving apparatus according to the second embodiment acts to improve image quality by modifying the image in such a manner that the reliability of the high frequency component of an image is improved, the image being an image lacking for reliability in the high frequency data thereof such as an image lacking for the high frequency data, an image from which the high frequency data is omitted or an image having the high frequency region to which noise has been mixed.

Referring to FIG. 6, image data obtained by cutting the image in block unit of m by n pixels is supplied from a line 40. The image data cut in block units is orthogonally converted by an orthogonal converter 41. The orthogonal converter 41 may be the same as the Hadamard converter 2. If the converter 41 is the same as the converter 2, the sequency data has the same structure as that of that shown in FIG. 2A. The sequency data is supplied to a high frequency masking portion 42. The determination of the sequency data to be masked is made by data stored in a masking position memory 43 after selecting it from the 15 sequency data items. The high frequency data whose reliability is insufficient is cut by the high frequency masking portion 11. The masking position memory is constituted of storage means such as a ROM. The masking position memory 43 stores, for example, the position of the element to be masked as shown in FIG. 2B. In the case of the Hadamard converter, since the elements disposed in the more right down portion are in the higher frequency band, data stored in the masking position memory 43 acts to determine the reliable frequency level of the sequency data. When AC components of the output from the orthogonal converter 41 are expressed by L+H since they are sum of sets of the high frequency components and the low frequency components, the output from the high frequency masking portion 42 becomes L.

The data L transmitted from the high frequency masking portion 42 is branched in parallel into two systems. One of them is supplied to a retrieval portion 45 for retrieving the nearest vector, and another system is supplied to a synthesizing portion 48. The synthesizing portion 48 synthesizes the output from the high frequency masking portion 42 and that from the low frequency masking portion 46. In the retrieval portion 45, the distances from all of the vectors registered in the table memory 5b to the data L from the masking portion 42 are calculated. As a result, the vector which is positioned at the shortest spatial distance is transmitted to the low frequency masking portion 46. That is, the vector retrieval performed in the retrieval portion 45 is a similar operation to the pattern matching operation rather than vector quantization. The nearest vector to the vector formed by only the low frequency sequency which is considered to be reliable is retrieved after the high frequency sequency has been added thereto. As a result, it is supplied to the low frequency masking portion 46, where the vector which has been retrieved in the retrieval portion 46 as the nearest to the input vector L is expressed by L'+H'.

On the other hand, the low frequency masking portion 14 masks the low frequency band with the high frequency data of the vector data (L'+H') which has not been used at the vector retrieval omitted. That is, the output from the masking portion 46 becomes H'. The output L from the high frequency masking portion 42 and the output H from the low frequency masking portion 46 are supplied to the synthesizing portion 48 in which they are synthesized. That is, the output from the synthesizing portion 48 becomes as follows:

$$L+H' \qquad (11)$$

In other words, the high frequency data in the sequency data is replace by the high frequency masking portion 42, the retrieval portion 45 and the low frequency masking portion 46. The thus replaced data is returned to an actual image data by the orthogonal converter 2 so as to be transmitted.

Since H' thus replaced is the high frequency portion of the vector which has been retrieved as a vector which has a strong correlation with the reliable L, L+H' becomes improved in its high frequency band.

<Third Embodiment>

Application to a Copying Machine

Figure 7:
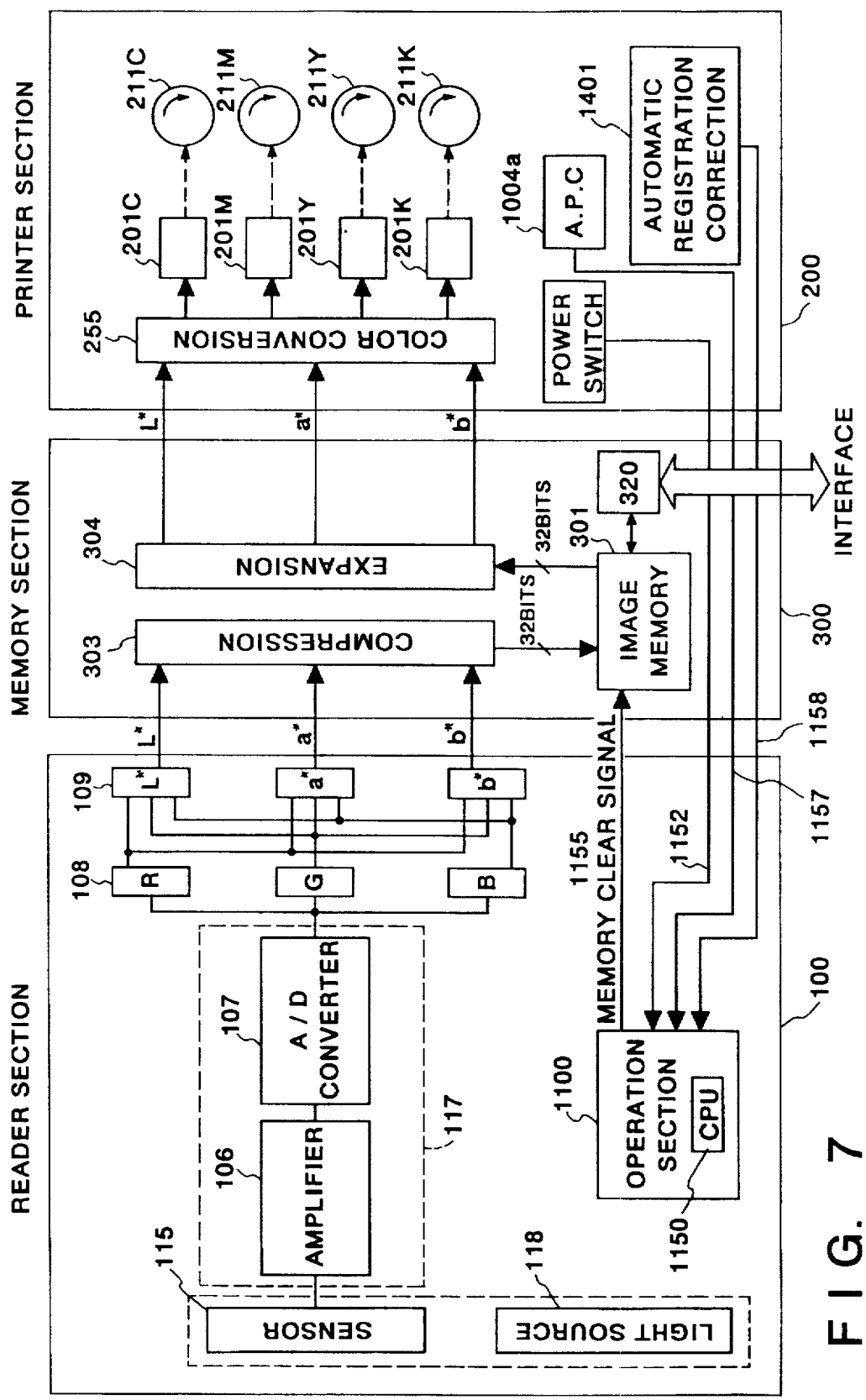
FIG. 7 is a block diagram which illustrates a third embodiment in which the present invention is applied to a copying machine.

FIG. 7 is a block diagram which illustrates a third embodiment of an apparatus structured in such a manner that the present invention is applied to a copying machine.

Schematic Structure of the Copying Machine

The copying machine comprises a reader section 100, a memory section 300 and a printer section 200.

As described above, reference numeral 100 represents the reader section, 115 represents a read sensor and 118 represents a light source for illuminating an original. Reference numeral 106 represents an amplifier portion for amplifying an analog image signal transmitted from the read sensor 115. The amplified analog image signal is supplied to an A/D converter 107. In this structure, the read sensor 115 is a CCD color sensor to which pixels each of which is represented by R (Red), G (Green) and B (Blue) signals are serially transferred, and they are transmitted therefrom. Reference numeral 108 represents a latch circuit for latching and holding the B, G and R signals in this sequential order to simultaneously transmit the color signals B, G and R for one pixel. Reference numeral 109 represents a color conversion portion in which L*, a* and b* signals are created from the B, G and R signals, the color conversion portion 109 being structured in the form of a look up table made by, for example, a ROM (Read Only Memory). Therefore, the output signal from the reader section 100 becomes L*, a* and b* signals.

Reference numeral 300 represents a memory section. The memory section 300 comprises a compression circuit 303, an expansion circuit 304 and an interface circuit 320 in addition to an image memory 301. The L* (brightness signal), a* (color signal) and b* (color signal) are independently compressed in the compression circuit 303. Finally, information about L*, a* and b* about a predetermined number of pixels is compressed to 32 bits so as to be supplied to the image memory 301.

The detailed operation of this will be described later.

The image signal stored in the image memory 301 is transmitted through a communication interface 320 or transmitted to the printer section 200. In the case where it is transmitted to the printer portion 200, the compressed image signal stored in the image memory 301 is read out by an expander 304 and is decoded so as to return to the original L*, a* and b* signals before transmitted to the printer portion 200.

The printer portion 200 receives the L*, a* and b* signals transmitted from the memory portion 300 in a color conversion portion 255 thereof. The color conversion portion 255 supplies the L*, a* and b* signals with switching them to laser units (201C, 201M, 201Y and 201K) in response to a command of non-synchronized write-timing signal (omitted from illustration) issued from a plurality of photosensitive bodies (211C, 211M, 211Y and 211K). Also, the color conversion portion also converts the image signals in the form of the L*, a* and b* signals into image signals representing toner C (cyan), M (magenta), Y (yellow) and K (black).

The laser unit according to this embodiment comprises 4 portions, 201C, 201M, 201Y and 201K so that image of C (cyan), M (magenta), Y (yellow) and K (black) is written in the photosensitive bodies (211C, 211M, 211Y and 211K). The 211C, 211M, 211Y and 211K are respectively in the form of a drum according to the present invention and disposed so as to correspond to the laser unit (211C, 211M, 211Y and 211K).

Numeral 1100 denotes a operator section. CPU 1150 connected to the section controls the reader, memory and printer sections in accordance with operator's instructions. For example, the contents of image memory 301 are erased in accordance with a memory clear signal 1155. Several signals input into the CPU 1150, such as power switch signal 1152 for the printer section, APC ready signal from a APC circuit 1004a which controls the laser power, and registration ready signal 1158 from an automatic registration correction circuit 1401.

Figure 8:
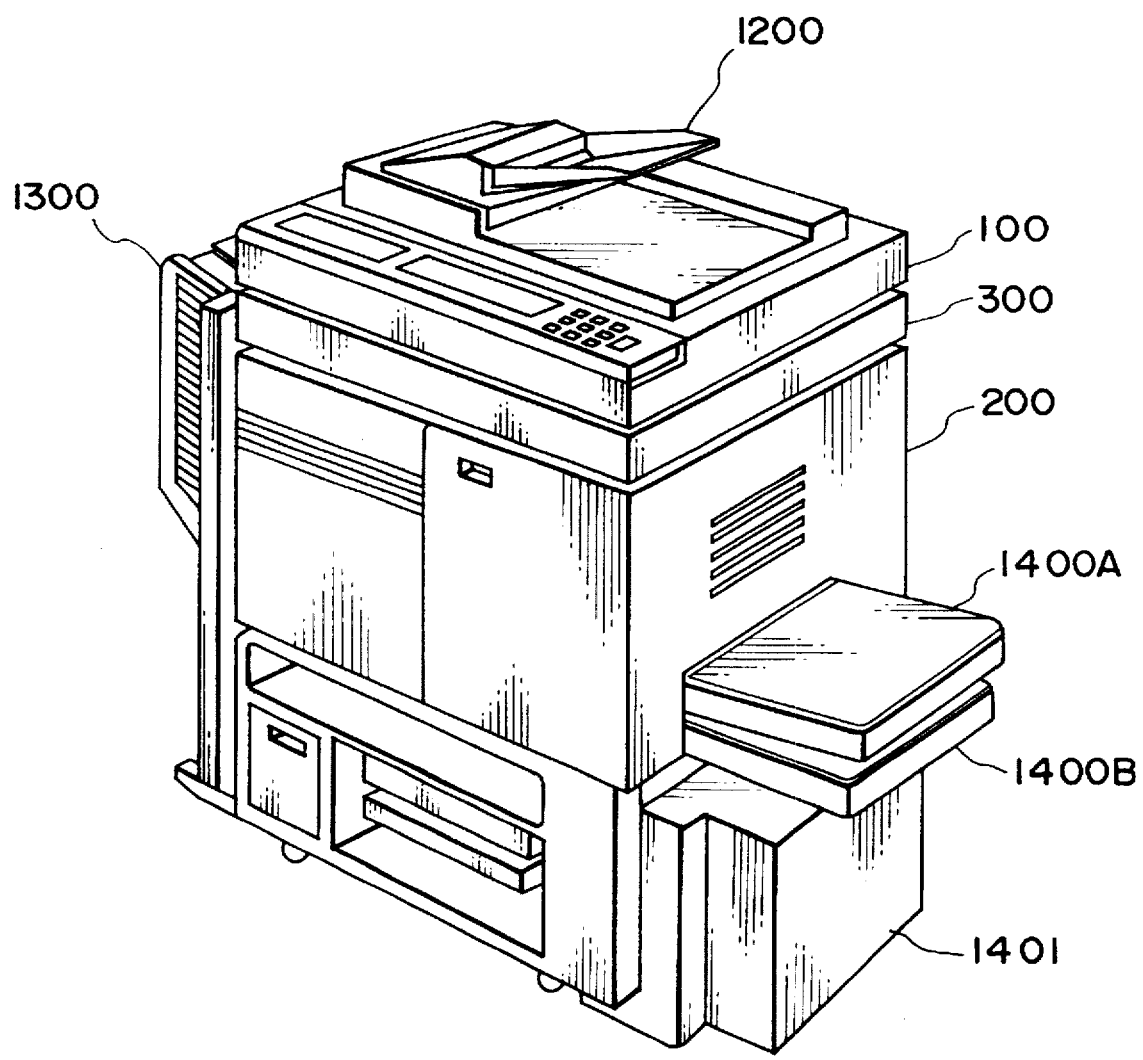
FIG. 8 is a perspective view which illustrates the appearance of the copying machine shown in FIG. 7.

FIG. 8 is a perspective view which illustrates the appearance of the digital color copying machine shown in FIG. 7. Referring to FIG. 8, as described above, reference numerals 100 represents the color reader section for storing an image signal, 300 represents a memory section for storing a compressed image signal and 200 represents a color printer section for forming a color image and transmit it. The copying machine according to this embodiment comprises a sorter 1300, an A.D.F (Auto Document Feeder) 1200 and a paper deck 1401 as option equipments.

The sorter 1300 aligns color copying paper sheets. The an A.D.F 1200 automatically supplies the original sheet. The deck 1401 stocks and supplies a large quantity of copying paper. Reference numerals 1400A and 1400B represent paper feeders which are, according to the present invention, in the form of vertical double cassettes.

Figure 9:
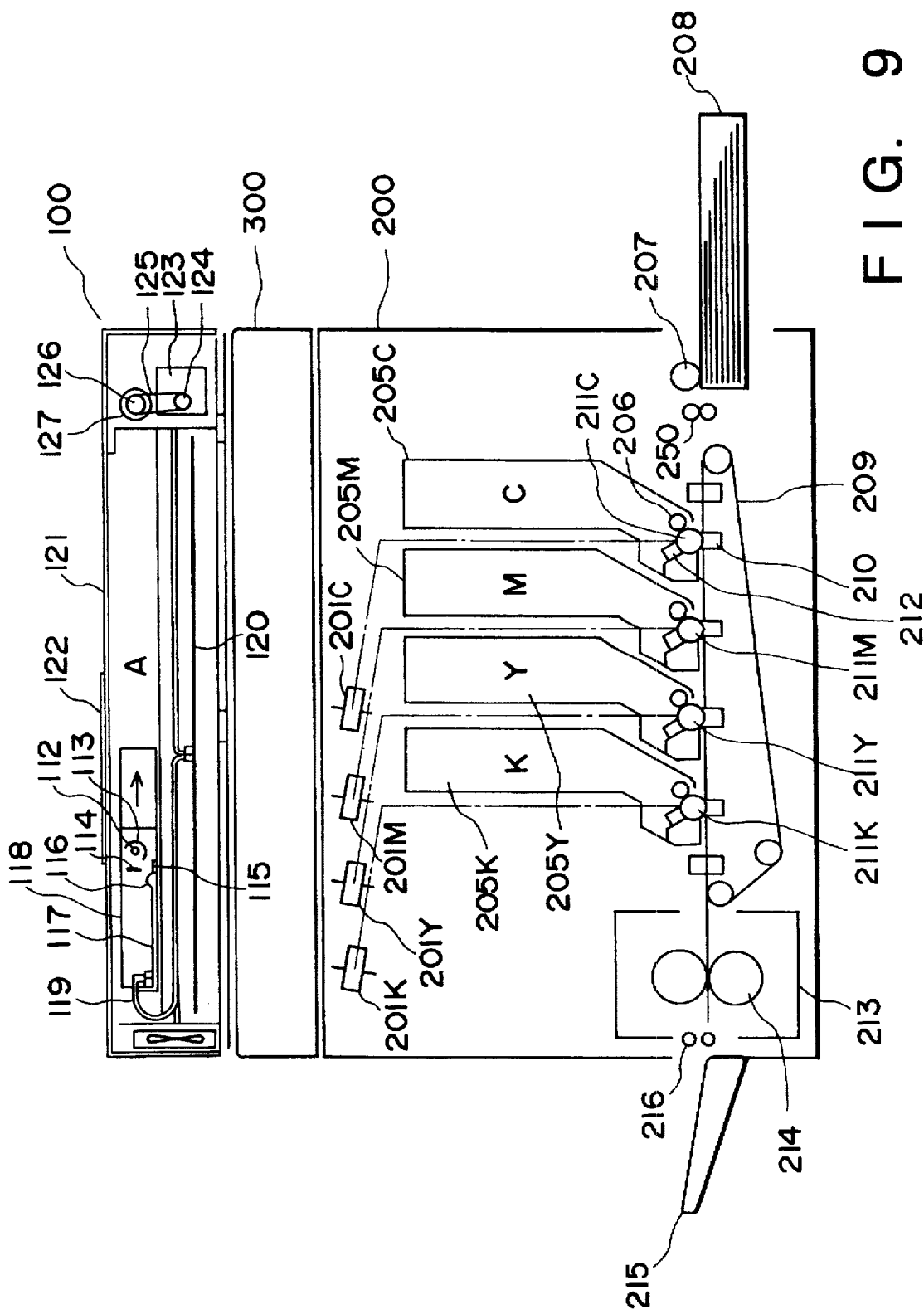
FIG. 9 is an internal structural view of the copying machine shown in FIGS. 7 and 8.

FIG. 9 illustrates the internal structure of the copying machine according to the third embodiment. The operation of each of the portions will be described later. Since FIG. 9 shows the minimum structure required to operate basically, the option equipments such as the sorter 1300 or the paper deck 1401 shown in FIG. 8 are omitted from the illustration.

Then, the reader section 100 will be described in detail with reference to FIG. 9. Referring to FIG. 9, reference numeral 112 represents an original illumination lamp serving as a light source, 113 represents a reflecting mirror, 114 represents a rod lens array for converging light reflected from the original 122 placed on the original setting glass 121 on to the read sensor 115. A scanning body 118 includes the original illuminating lamp 112, the reflecting mirror 113, the rod lens array 114, the read sensor 115 and an A/D conversion circuit 117. The A/D conversion circuit 117 A/D-converts the image signal transmitted from the read sensor 115 through a signal line. The above-described components 112 to 117 included by the scanning body 118 and the scanning body 118 perform linear actions with integrated to one another in the direction designated by an arrow A. A control circuit 120 stores, calculates and transmits an image signal of a predetermined number of bits, which is 8 bits according to this embodiment, transmitted from the A/D conversion circuit substrate 117 through a signal line 119.

As shown in FIG. 9, the color printer 200 in the form of a 4-serial drum type is structured by four units (205C, 205M, 205Y and 205K) centered at the photosensitive drums (211C, 211M, 211Y and 211K). Each of the units has a color developing machine each of which includes toner of independent colors. Referring to FIG. 9, the laser oscillators (201K, 201Y, 201M and 201C) correspond to color signals respectively representing K (black), Y (yellow), M (magenta) and C (cyan).

The copying machine includes a polygon mirror (omitted from illustration) so that laser beams scan in the main scanning direction when the polygon mirror rotates. Thus, one line is formed.

The photosensitive drum 211 for 1 unit rotates clockwise so that the surface of the photosensitive body thereof is charged by a charger 212. Thus, image information is written on the drum due to the switching of/off of the laser beam. Although the image thus formed is a latent image, the latent image is made visible (an apparent image) when color toner is adhered thereto by a development sleeve 206. The thus formed apparent image is transcribed by a transfer charger 210 to a copying paper supplied by a supply roller 207 from the paper cassette 208. In this case, the margin of the image is adjusted by a register roller 250.

The copying paper is convey ed by a conveyance belt 209 from the development unit 211C for C (cyan) to the development unit 211M for the next color M (magenta). Thus, the toner images are overlapped successively during the conveyance through the development unit 211Y for Y (yellow) and the development unit 211K for K (black). When the color toner of the four color has been adhered on the copying paper, the copying paper is transferred to a heating fixing device 213 at which the color image is fixed by heat. The copying paper is then placed on a copy tray 215 by an paper-exhausting roller 216.

Compression Portion and Expansion Portion

The compressing portion 303 and the expansion portion 304 shown in FIG. 7 will be described in detail.

The compression portion 303 shown in FIG. 7 is structured as shown in FIG. 10A so that the compression L* and compressions a* and b* are independently performed. FIG. 10B illustrates the internal blocks of the L* compression portion 401.

Referring to FIG. 10B, the L* signal is supplied to a line buffer 401 in which it is transformed into blocks each of which is formed by 4 pixels×4 pixels. The L* signal which has been sectioned to the above-described blocks is subjected to orthogonal transformation by the Hadamard converter 2 so as to be divided into DC component DC and AC component AC. The direct current component DC is transmitted to a scalar quantizer 403, while AC component is transmitted to a high frequency masking circuit 405, a classifying device 404. The scalar quantizer 403 takes only MSB of 8 bits of the direct current component DC thus input so as to transmit it as a DC code.

The classifying device 404 classifies the input block data formed by 16 pixels into the following four classes in accordance with energy of the AC spectrum and the deviation of the same:

Class 0—plane
Class 1—vertical edge
Class 2—lateral edge
Class 3—diagonal

The above-described classes are expressed by using 2 bits.

The high frequency masking portion 405 receives the AC component from the Hadamard converter 2 and the class code expressed by 2 bits and transmitted from the classifying device 404 so that high frequency masking as shown by any of the hatching sections shown in FIGS. 11A to 11D is performed in accordance with the value of the thus received code, namely the characteristics of image. Referring to FIGS. 11A to 11D, the portions shown with mark x represent DC components, while the portions in which numerals are entered represent portions which are subjected to scalar quantization by the scalar quantizer 406.

The scalar quantizer 406 disposed next to the high frequency masking portion 405 also receive the above-described class codes each of which is formed by 2 bits and performs the scalar quantization of the bit distribution in any of manners shown in FIGS. 11A to 11D in accordance with the received class codes, namely the characteristics of image. For example, if the received class is "1", the bit distribution is quantized in such a manner that the bits are arranged to be "4", "4", "3", "2" and "2" corresponding to five components $A_1$ to $A_5$. As a result, the total number of bits becomes 15.

A vector quantizing portion 407 is formed by a ROM 408 as shown in FIG. 12. The ROM 408 receives 15-bit data after the scalar quantization and class codes expressed by 2 bits in the form of a vector of 15 bits and outputs the index of 10 bits of the nearest vector in the table.

Data to be stored in the ROM 408 is the index of the nearest vector of the above-described vector supplied to the address portion of the ROM 408. That is, each of the states which can be supplied is expressed by a vector having 15-dimensional data (high frequency data included), and the vector which is the nearest, in terms of the spatial distance, to the input vector is previously calculated so as to cause the index of the vector which is the solution of the calculation to be stored. Since the high frequency band of the input data has been masked, only the low frequency band data is subjected to the calculation carried out prior to the retrieval for the nearest vector. In this case, each of the classes independently has the code book, and each of the code books has 15-dimensional data.

When the specifications is made to distribute the sequency components as shown in FIG. 2A and $A_1$ to $A_{15}$ are varied with respect to each of the classes "0" to "3", the indexes expressing the output vector are shown in FIGS. 13A to 13D.

Thus, 8-bit DC codes are transmitted from the CD scalar quantizer 403, 2-bit class codes are transmitted from the classifying device 404, and 10-bit indexes are transmitted from the vector quantizer 407. Therefore, a total of 20 bits are, as the compressed data, transmitted from the L* compressor 401 so as to be written in the image memory 301 shown in FIG. 7.

Similarly to the L* compressor, the average value within the 4-by-4 pixel block, and the compressed code which has been obtained as the result of the above vector quantization are transmitted from the a*b* compressor 402. However, 12 bits are transmitted from the compressor 402. That is, codes of a total of 32 bits are transmitted from the compressor shown in FIG. 7 so as to be written in the memory 301.

Figure 14:
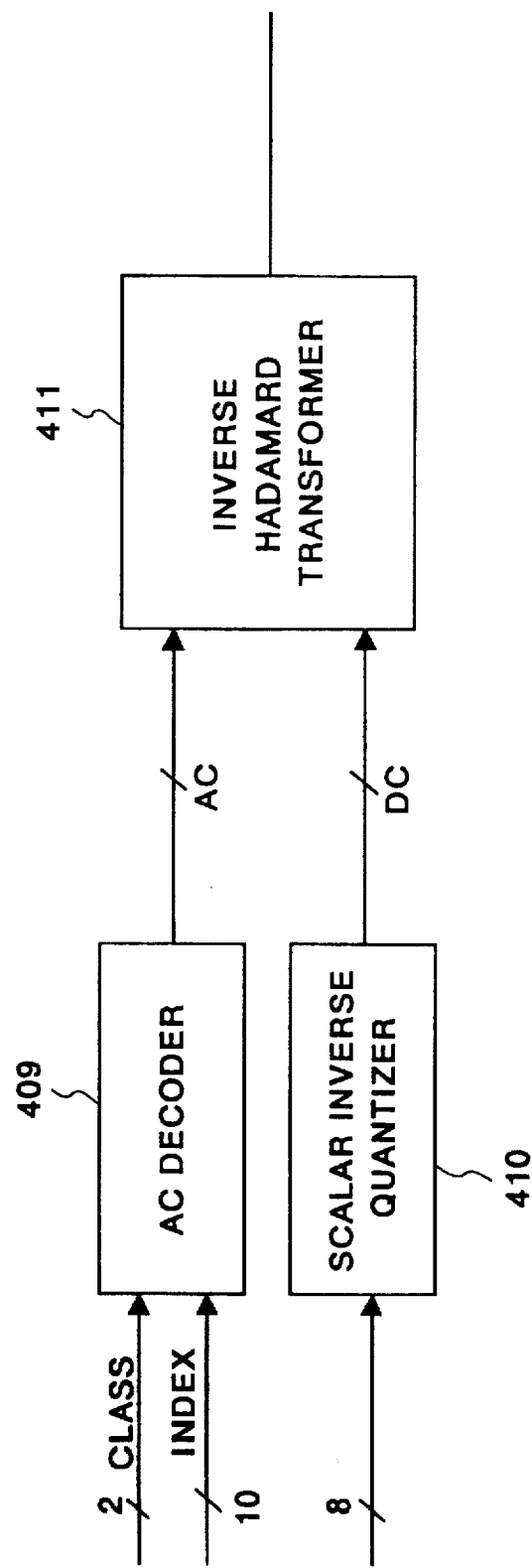
FIG. 14 is a block diagram which illustrates the structure of an expander according to the third embodiment.

Referring to FIG. 14, the expanding portion 304 shown in FIG. 7 will be described.

In the expanding portion 304, the compressed code is taken from the image memory 301 so as to be decoded. The 32-bit compressed code corresponding to the block of 4×4 pixels is divided into 20-bit L* compressed code and 12-bit a* and b* compressed code. The 20-bit L* compressed code is divided into 2-bit class code, 10-bit index code and 8-bit DC code.

The 8-bit DC code is decoded by being shifted to the left by 2 bits in a scalar inverse quantizer 410 shown in FIG. 14.

An AC decoder 409 is formed by a ROM and sectioned into four segments each of which is specified by a class code (2 bits), namely the characteristics of image. The 10-bit index code specifies one output vector (15 dimensional) in a segment specified by the class code. Each segment is composed similarly to in the decoder of the first embodiment shown in FIG. 5. An output vector from the segment is composed in a data structure which includes a high frequency component. The high frequency component to be added varies in accordance with the segment, namely the characteristics of image, even for the same index codes. Thus, the 15-dimensional AC data and the CD data which has been decoded by the inverse quantizer 410 are synthesized so as to generate a 4×4 complete matrix. The matrix data is supplied to a Hadamard inverse converter 411 so that a 4×4 actual image data block is transmitted.

Then, the classification performed by the classifying device 404 will be described.

Figure 15:
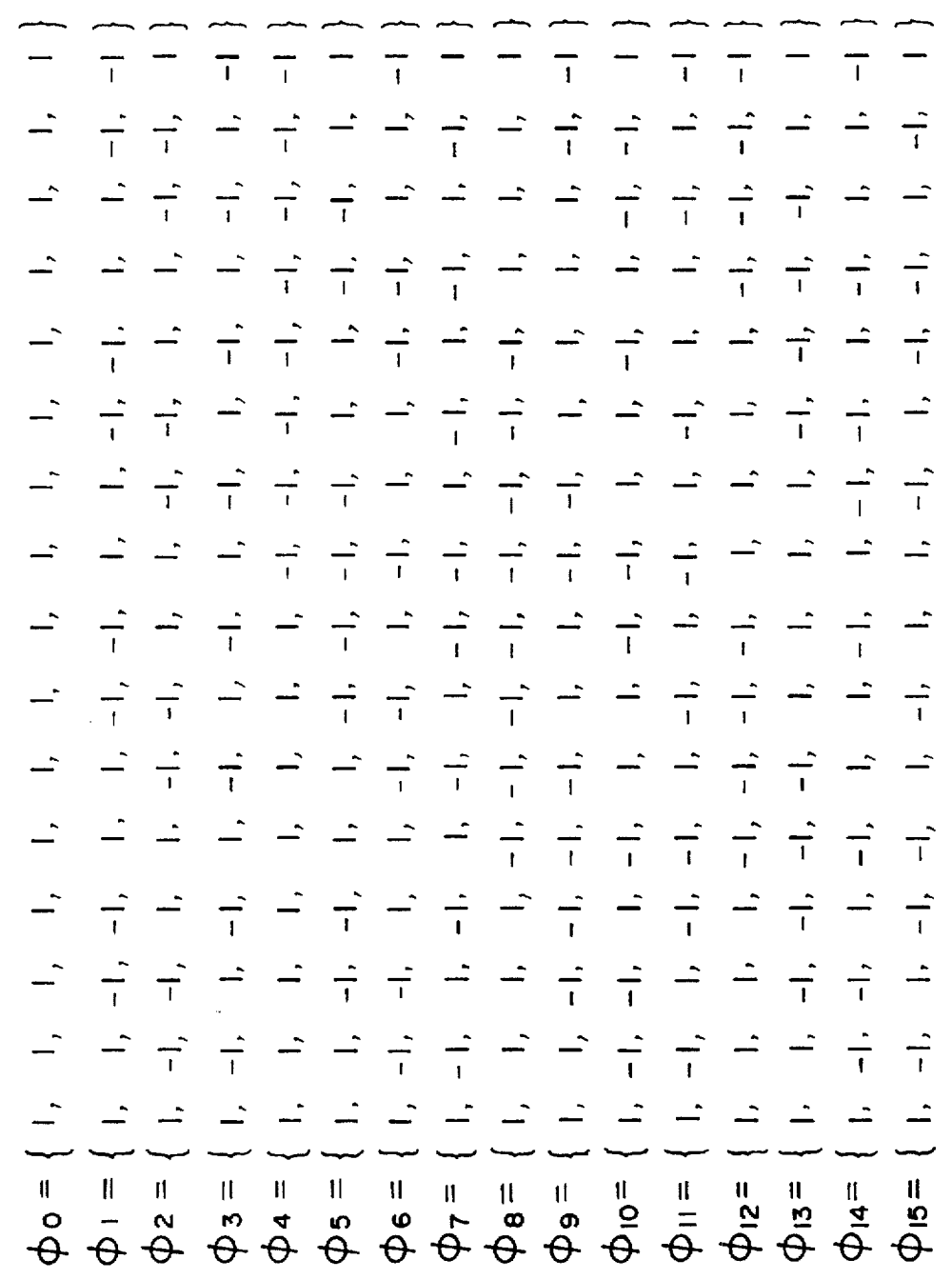

Hadamard transformation according to the third embodiment is an operation of orthogonal transformation performed on the basis of $\phi_0$ to $\phi_{15}$ shown in FIG. 15. That is, the 16-dimensional vector V which has been supplied is expressed by:

$$V = 1/4 \sum_i a_i \phi_i \qquad (12)$$

The input vector applies all of the pixel values in a block of 4 pixels×4 pixels. The pixel value is arranged to be 0 to 255 when expressed by 8 bits.

In this state, when $a_i$ is obtained in accordance with:

$$a_i = \frac{1}{4}(\phi_i \cdot V) \qquad (13)$$

$a_0$ can be expressed by 10 bits from 0 to 1023, while $a_1$ to $a_{15}$ can be expressed by 10 bits from −512 to 512.

In this state, $L_s$, $V_s$ and $H_s$ are respectively defined as follows as a physical quantity for classification:

$$L_s = |a_1| + |a_2| + |a_4| + |a_5| + |a_8| \qquad (14)$$

$$V_s = |a_1| + |a_2| + |a_3| \qquad (15)$$

$$H_s = |a_4| + |a_8| + |a_{12}| \qquad (16)$$

Symbol $L_s$ in Equation (14) shows the level of energy in the low frequency band which becomes enlarged when an sharp edge structure is included in the original image, $V_s$ shows the intensity of the vertical line components in the original image and $H_s$ shows the intensity of the lateral line components in the original image. The characteristics of an input image are classified into the following four classes by using the above-described physical quantities:

When Ls<50, class 0: plain

When ≧50 and also Vs>2*Hs, class 1: vertical edge

When ≧50 and also Hs<2*Vs, class 2: lateral edge

When Ls>50 and not classified into classes 1 and 2, class 3: vertical edge

As a result of the above-described classification, the masking of the high frequency band can be performed in accordance with the energy distribution.

Meanwhile, although Hadamard transform is utilized as orthogonal transform in the above embodiments, a discrete cosine transform or discrete Fourier transform can also be utilized.

The DC scalar quantization is not limited to a linear quantization and non-linear quantization can be applied to the present invention. The quantizer can be comprised of ROM or RAM and so on.

The classification of an edge according to the present invention is not limited to four kinds of plane, vertical, lateral and diagonal. More specifically, the directions of the edge can be more finely classified. Also the class can be sorted into a letter image, screened image and half tone image. Furthermore, the form of high frequency mask and the bit-assignment of AC components in the mask can vary in accordance with the class.

Furthermore, the present invention can also adopt a color ink-jet printer, color dot printer, color thermal transfer printer or color thermal printer as well as color laser printer. The present invention is especially effective in frame-sequenced recording method in which Y, M, C, K are sequentially recorded, especially in a method wherein the storage of one-frame image data is necessary.

The present invention is also not limited to the above embodiments and and therefore various changes and modifications can be made within the spirit and scope of the present invention. To apprise the public of the scope of the present invention, the following claims are made.

What is claimed is:

1. A computer-based decoding apparatus comprising:

receiving means for receiving a code obtained by coding a first set of spatial frequency components of image data;

decoding means, coupled to said receiving means, for receiving and decoding said code, for adding a second set of spatial frequency components which includes non-zero values and which was not received by said receiving means, to said first set of spatial frequency components by using a correlation between said first and second sets of spatial frequency components, and for outputting the added first and second sets of spatial frequency components; and post-processing means for combining the first and second sets of spatial frequency components to form an image to be output, wherein said decoding means adds the second set of spatial frequency components which comprises non-zero values in a frequency space.

2. The apparatus according to claim 1, wherein said first set of spatial frequency components comprise orthogonally transformed blocks of said image data.

3. The apparatus according to claim 2, wherein said first set of spatial frequency components further comprise a masked higher frequency component of a frequency component of the orthogonal transform.

4. The apparatus according to claim 2, wherein said correlation of said first and second sets of spatial frequency components is between low and high frequency components within the image data.

5. The apparatus according to claim 4, wherein said correlation of said spatial frequency components is dependent on characteristics of the image data.

6. The apparatus according to claim 5, wherein said characteristics of the image data is defined as the presence of an edge or the direction of an edge in the image data.

7. The apparatus according to claim 1, wherein said decoding means comprises a read only memory.

8. An image processing apparatus comprising:

input means for inputting image data;

extracting means for extracting first and second sets of spatial frequency components from the input image data by pre-processing said image data;

vector quantizing means for vector-quantizing the first set of spatial frequency components from said first and second sets of spatial frequency components into a quantized code;

memory means for storing said quantized code;

decoding means coupled to said memory means for receiving and decoding said quantized code, and for adding the second set of spatial frequency components which includes non-zero values and which was not stored in said memory means to said decoded quantized code by using a correlation between said first and second set of spatial frequency components; and output means for post-processing the output of said decoding means and outputting the processed image data, wherein said decoding means adds the second set of spatial frequency components which comprises non-zero values in a frequency space.

9. The image processing apparatus according to claim 8, wherein said input means comprises reader means for scanning a color image and outputting color image data.

10. The image processing apparatus according to claim 8, wherein said pre-processing is an orthogonal transform and said post-processing is an inverse orthogonal transform.

11. The apparatus according to claim 8, wherein said correlation of said spatial frequency components is between low and high frequency components within the image data.

12. The apparatus according to claim 8, wherein said correlation of said spatial frequency components is dependent on a characteristics of the image data.

13. The apparatus according to claim 12, wherein said characteristics of the image data is defined as the presence of an edge or a direction of an edge in the image data.

14. The apparatus according to claim 8, wherein said decoding means comprises a read only memory.

15. A computer-based decoding method comprising the steps of:

receiving a code obtained by coding a first set of spatial frequency components of image data through a transmission line;

storing said code in a memory;

decoding said stored code, outputting said first set of spatial frequency components, and adding a second set of spatial frequency components which includes non-zero values and which was not received through the transmission line to said first set of spatial frequency components by using a correlation between said first and second sets of spatial frequency components; and combining said first and second sets of spatial frequency components to form an image to be output, wherein, in the decoding step, the addition of the second set of spatial frequency components comprises the addition of non-zero values in a frequency space.

16. The method according to claim 15, wherein said first set of spatial frequency components comprise orthogonally transformed blocks of said image data.

17. The method according to claim 16, wherein said first set of spatial frequency components further comprises a masked higher frequency component of a frequency component of the orthogonal transform.

18. The method according to claim 16, wherein said correlation of said first and second sets of spatial frequency components is between low and high frequency components within the image data.

19. The method according to claim 18, wherein said correlation of said first spatial frequency components is dependent on a characteristic of the image data.

20. The method according to claim 19, wherein said characteristics of the image data is defined as the presence of an edge or a direction of an edge in the image data.

* * * * *